United States Patent
Cohen et al.

(10) Patent No.: US 8,574,969 B2
(45) Date of Patent: *Nov. 5, 2013

(54) CMOS WITH CHANNEL P-FINFET AND CHANNEL N-FINFET HAVING DIFFERENT CRYSTALLINE ORIENTATIONS AND PARALLEL FINS

(75) Inventors: Guy M. Cohen, Moehgan Lake, NY (US); Katherine L. Saenger, Ossining, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 13/560,322

(22) Filed: Jul. 27, 2012

(65) Prior Publication Data
US 2012/0299067 A1 Nov. 29, 2012

Related U.S. Application Data

(62) Division of application No. 12/197,459, filed on Aug. 25, 2008, now Pat. No. 8,241,970.

(51) Int. Cl.
*H01L 21/00* (2006.01)
(52) U.S. Cl.
USPC .............. 438/150; 257/E21.09; 257/E29.004
(58) Field of Classification Search
USPC ........ 156/345.24; 257/255, E29.004, E21.09; 438/150, 196, 487
See application file for complete search history.

(56) References Cited

U.S. PATENT DOCUMENTS

| | | | |
|---|---|---|---|
| 6,790,733 B1 | 9/2004 | Natzle et al. | 438/300 |
| 6,794,313 B1 | 9/2004 | Chang | 438/770 |
| 6,911,383 B2 | 6/2005 | Doris et al. | 438/588 |
| 2005/0116290 A1 | 6/2005 | De Souza et al. | |
| 2005/0239242 A1* | 10/2005 | Zhu et al. | 438/199 |
| 2005/0280121 A1 | 12/2005 | Doris et al. | 257/629 |
| 2006/0272574 A1 | 12/2006 | Waite et al. | 117/89 |
| 2006/0292781 A1 | 12/2006 | Lee | 438/197 |
| 2007/0052027 A1 | 3/2007 | Ke et al. | |

(Continued)

OTHER PUBLICATIONS

"Mask-edge defects in hybrid orientation direc-Si-bonded substrates recrystallined by solid phase epitaxy after patterned amorphization" by Saenger et al., pub. Apr. 24, 2007.*
Saenger, et al., "Amorphization/templated recrystallization method for changing the orientation of single-crystal silicon: An alternative approach to hybrid orientation substrates," *Applied Physics Letters*, 87, 221911, © 2005 American Institute of Physics, 3 pages.
Saenger, et al., "Amorphizationfremplated Recrystallization (ATR) Method for Hybrid Orientation Substrates," *Mater. Res. Soc. Symp. Proc.*, vol. 913 (2006), © 2006 Materials Research Society, 9 pages.

(Continued)

*Primary Examiner* — David Vu
*Assistant Examiner* — Duy T Nguyen
(74) *Attorney, Agent, or Firm* — Thomas Grzesik; Fleit Gibbons Gutman Bongini & Bianco PL

(57) ABSTRACT

An integrated circuit fabrication apparatus is configured to fabricate an integrated circuit with at least one p-FinFET device and at least one n-FinFET device. A bonding control processor is configured to bond a first silicon layer having a first crystalline orientation to a second silicon layer having a second crystalline orientation that is different from the first crystalline orientation. A material growth processor is configured to form a volume of material extending through the first silicon layer from the second layer up to the surface of first layer. The material has a crystalline orientation that substantially matches the crystalline orientation of second layer. An etching processor is configured to selectively etch areas of the surface of the first layer that are outside of the region to create a first plurality of fins and areas inside the region to create a second plurality of fins.

4 Claims, 8 Drawing Sheets

(56) References Cited

U.S. PATENT DOCUMENTS

2007/0241323 A1 10/2007 Saenger et al.
2007/0281446 A1 12/2007 Winstead et al.
2008/0020515 A1 1/2008 White et al.

OTHER PUBLICATIONS

Yang, et al., "Hybrid-Orientation Technology (HOT): Opportunities and Challenges," *IEEE Transactions on Electron Devices*, vol. 53, No. 5, May 2006, pp. 965-979.

Saenger, et al., "A study of trench-edge defect formation in (001) and (011) silicon recrystallized by solid phase epitaxy," *Journal of Applied Physics*, 101, 024908 (2007), © 2007 American Institute of Physics, 8 pages.

Saenger, et al., "Mask-edge defects in hybrid orientation direct-Si-bonded substrates recrystallized by solid phase epitaxy after patterned amorphization," *Journal of Applied Physics*, 101, 084912 (2007), © 2007 American Institute of Physics, 7 pages.

\* cited by examiner

CMOS WITH CHANNEL P-FINFET AND CHANNEL N-FINFET HAVING DIFFERENT CRYSTALLINE ORIENTATIONS AND PARALLEL FINS

CROSS-REFERENCE TO RELATED APPLICATIONS

This application is a divisional of and claims priority from prior U.S. patent application Ser. No. 12/197,459 filed on Aug. 25, 2008, now U.S. Pat. No. 8,241,970; the entire disclosure is herein incorporated by reference in its entirety.

FIELD OF THE INVENTION

The present invention relates generally to silicon devices and fabrication techniques thereof, and more particularly relates to non-planar devices with different surface crystal orientations.

BACKGROUND OF THE INVENTION

As scaling of integrated circuits continues, non-planar device structures such as the FinFET are becoming increasingly attractive as device options because of their good short channel characteristics. A fin-type field effect transistor ("FinFET") is a type of transistor that has source and drain regions in contact with a channel region contained in a semiconductor fin. Nearly all FinFETs are fabricated as double-gate FETs with opposing first and second gate conductors on either sidewall of the fin. FinFETs are discussed in greater detail in U.S. Pat. No. 6,413,802 to Hu et al., which is hereby incorporated by reference in its entirety.

In the following discussion, crystalline silicon is used as an example and the crystalline planes of the crystalline silicon are denoted by the commonly used Miller indices (see definition in Ashcroft/Mermin, Solid State Physics, pp. 91-93, Cornell University, 1976, which is hereby incorporated by reference in its entirety). For example, (100), (010), and (001) are all equivalent in a cubic crystal by virtue of symmetry. Similarly (110), (101) and (011) are all equivalent crystal planes.

To maximize the CMOS performance it is desirable to pair p-FinFETs having a (110) oriented channel surface with n-FinFETs having a (100) oriented channel surface. When using conventional substrates where the notch is aligned with the (110) direction and the wafer's surface is parallel to the (100) direction, the fins of the p-FinFETs are generally etched parallel to the notch to obtain a (110) oriented channel while the fins for n-FinFETs are etched at a 45 degrees off the notch to obtain a (100) oriented channel. Similarly, when the wafer's surface is (110), the fins forming the p-FinFETs and the fins forming the n-FinFETs are perpendicular to each other (i.e. the fins are forming a right angle).

However, due to lithographic constraints and the drive to obtain denser layouts, it is desired that the fins of the CMOS pair be parallel. This requirement generally leads to the use of CMOS pairs in which both devices have the same channel crystal orientation and usually leads to sub-optimal performance of the devices. Stated differently, current fabrication methods that form parallel fins use CMOS pairs having the same channel crystal orientation, which results in sub-optimal performance of the device pairs.

Therefore a need exists to overcome the problems with the prior art as discussed above.

SUMMARY OF THE INVENTION

Briefly, in accordance with the present invention, disclosed in one embodiment is an integrated circuit fabrication apparatus configured to fabricate an integrated circuit with at least one p-FinFET device and at least one n-FinFET device. A bonding control processor is configured to bond a first silicon layer having a first crystalline orientation to a second silicon layer having a second crystalline orientation that is different from the first crystalline orientation. A material growth processor is configured to form, in a region of a surface of the first silicon layer, a volume of material extending through the first silicon layer from the second layer up to the surface of first layer. The material has a crystalline orientation that substantially matches the crystalline orientation of second layer. An etching processor is configured to selectively etch areas of the surface of the first layer that are outside of the region to create a first plurality of fins and areas inside the region to create a second plurality of fins. The first and second plurality of fins are parallel to each other.

In yet another embodiment, an integrated semiconductor circuit is disclosed. The integrated circuit includes at least one single-crystal fin having a first crystal orientation. The integrated circuit also includes at least one single-crystal fin having a second crystal orientation. The single single-crystal fin having the first crystal orientation and the single-crystal fin having the second crystal orientation are substantially parallel.

In a further embodiment, an electronic circuit including at least one p-FinFET device and at least one p-FinFET device is disclosed. The at least one p-FinFET device and the at least one p-FinFET device are situated parallel to each other on a hybrid orientation semiconductor substrate. The integrated circuit is fabricated according to a process comprising bonding a first silicon layer having a first crystalline orientation to a second silicon layer having a second crystalline orientation different from the first. A volume of material is formed in a region of a surface of the first silicon layer that extends through the first silicon layer from the second layer up to the surface of first layer. The material has a crystalline orientation that substantially matches the crystalline orientation of second layer. An etching processor adapted to selectively etch areas of the surface of the first layer that are outside of the region to create a first plurality of fins and areas inside the region to create a second plurality of fins. The first and second pluralities of fins are parallel to each other.

DETAILED DESCRIPTION

As required, detailed embodiments of the present invention are disclosed herein; however, it is to be understood that the disclosed embodiments are merely examples of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure and function. Further, the terms and phrases used herein are not intended to be limiting; but rather, to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

Conventional FinFET Orientation

Figure 1:
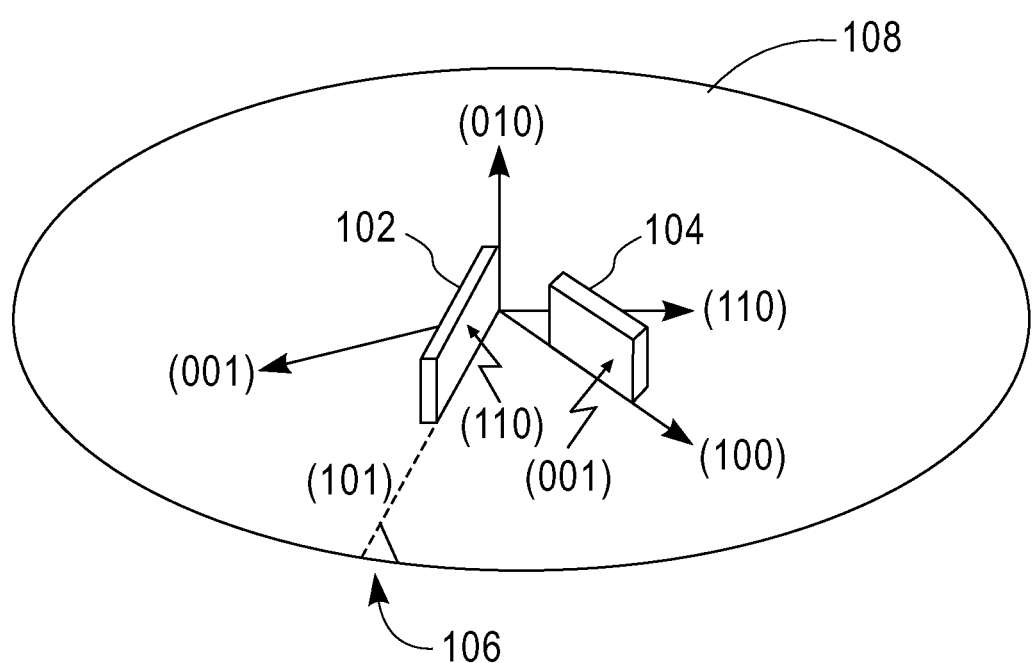
FIG. 1 illustrates a silicon wafer comprising a conventional orientation of a fin for a p-FinFET and a conventional orientation of a fin for an n-FinFET.

FIG. 1 shows a top view of a substrate 108 including conventionally orientated fin 102 for a p-FinFET and a conventionally orientated fin 104 for an n-FinFET. Various vectors are shown that correspond to the crystalline orientation of the substrate 108, according to well known crystalline plane descriptors such as (100), (110), and the like. The substrate 108 includes a notch 106 that indicates a crystal orientation of (101). N-FinFETS are generally formed in a silicon substrate with a (100) surface orientation as this orientation has higher electron mobility. P-FinFETs are generally formed with a (110) surface orientation where hole mobility is higher. In conventional substrate fabrication, as shown in FIG. 1, the notch 106 is aligned with the (110) orientation and the wafer's surface is parallel to the (100) orientation; the fins 102 of the p-FinFET are etched parallel to the notch 106 while the fins 104 for the n-FinFET are etched at a 45 degrees off the notch 106 to obtain a (100) oriented channel.

The fins 102, 104 are etched at 45 degree angles with respect to one another to optimize the performance of the p-FinFET and n-FinFET CMOS pair. In other words the fins 102, 104 are not parallel because the p-FinFET is aligned to a (110) surface orientation and the n-FinFET is aligned to a (100) surface orientation. Having non-parallel FinFETS becomes problematic in high density circuit layouts and is difficult to print when lithography is limited by diffraction. In contrast to the above-described conventional fabrication techniques, various embodiments of the present invention provide CMOS FinFET pairs that have n-FinFETs aligned with (100) crystalline planes and p-FinFETS aligned with (110) crystalline planes, but where all fins of both types of FinFETS are also all parallel to one another so that lithography and layout constraints are satisfied. Stated differently, the various embodiments of the present invention allow fins aligned with different crystalline planes to be physically parallel on the same wafer. The fins are parallel, but are oriented along different crystalline planes, e.g. along (100) and (110) crystalline planes.

Figure 2:
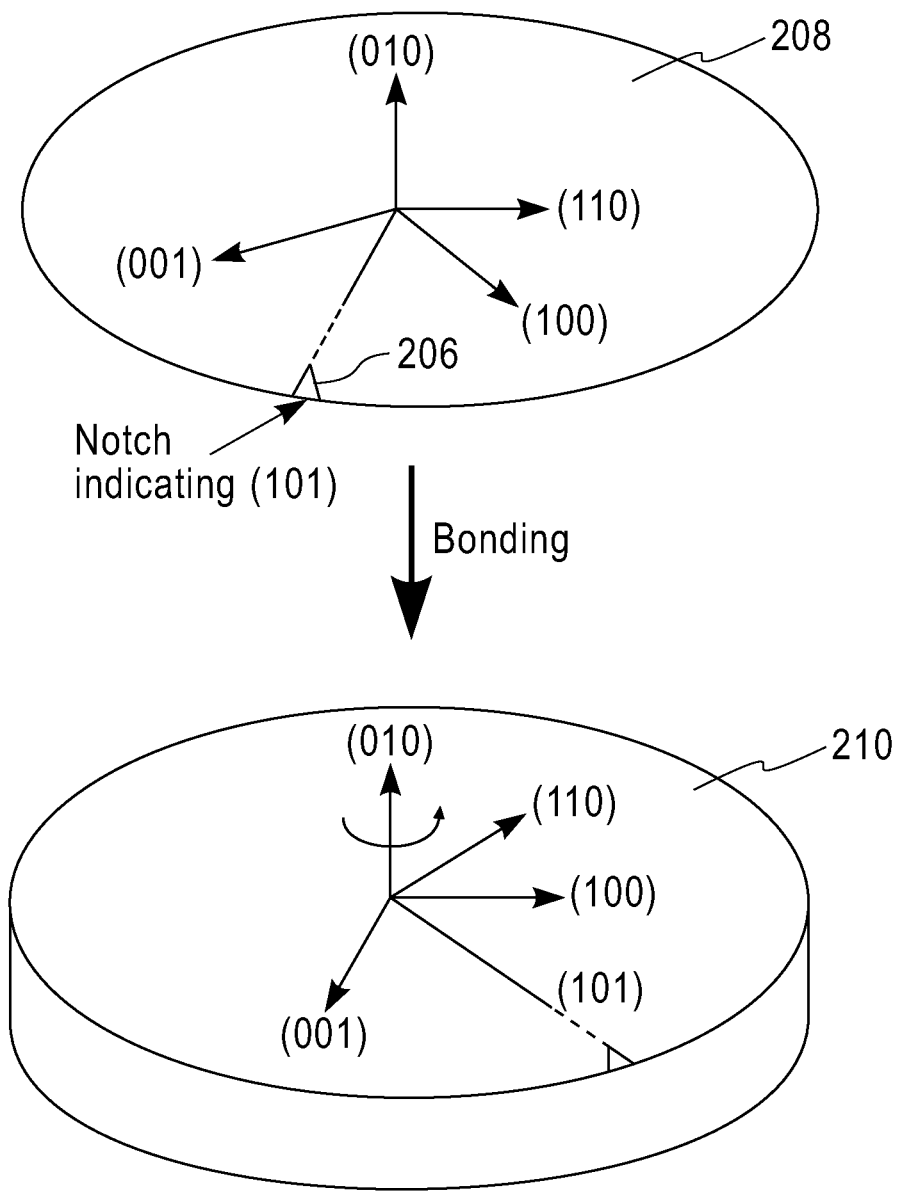
FIG. 2 illustrates a first silicon layer with a (100) orientation and a second silicon layer with a (100) orientation, where the second silicon layer is rotated with respect to the first layer, in accordance with one embodiment of the present invention.
Figure 3:
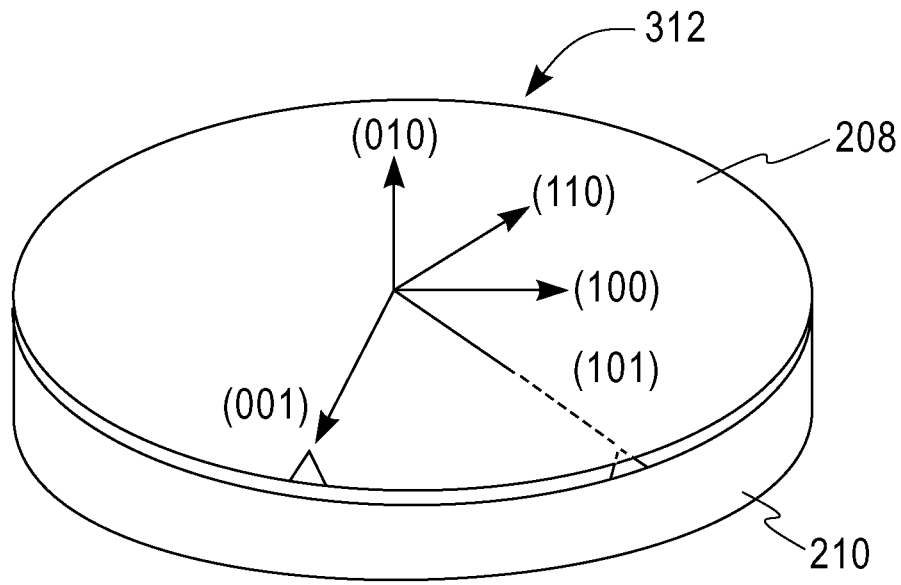
FIG. 3 illustrates a twist-bonded wafer comprising the first and second silicon layers of FIG. 2, in accordance with one embodiment of the present invention.

FIG. 2 shows top views of two crystalline layers, a top silicon layer 208 and lower silicon layer 210, for fabricating a twist-bonded wafer 312 (described below in regards to FIG. 3) in accordance with one embodiment of the present invention. The top silicon layer 208 and the lower silicon layer 210 of one embodiment are featureless bulk crystalline silicon wafers. One embodiment of the present invention utilizes a top silicon layer 208 that is a thin membrane of crystalline silicon. Layer 208 is taken from a conventional bulk crystalline silicon wafer (the donor wafer) by a method such as (but not limited to) SmartCut™, and the lower silicon layer 210 is a conventional bulk crystalline silicon wafer utilized as a handle wafer. Utilizing a technique such as the SmartCut™ technique, a donor wafer is implanted with hydrogen. The depth of the hydrogen implantation defines the thickness of layer 208. The donor wafer is bonded to the handle wafer 210. The bonded wafers are annealed. The annealing causes the hydrogen to form blisters, which act to separate layer 208 from the donor wafer. The resulting structure is wafer 210 with a bonded layer 208 as shown in FIG. 3. Although the following description of one embodiment of the present invention describes processing of entire bulk silicon wafers, further embodiments are able to work with crystalline substrates of any suitable thickness or size.

FIG. 2 shows a thin top silicon layer 208 that is to be bonded to a receiving (handle) lower silicon wafer 210. In one embodiment of the present invention, the thin top silicon layer 208 is twist-bonded to the receiving lower silicon wafer 210 wherein these two layers are bonded such that the crystalline structure of the thin top silicon layer 208 is oriented at a pre-defined angle relative to the crystalline structure of the receiving lower silicon wafer 210. In the example of FIG. 2, the thin top silicon layer 208 has its crystalline structure rotated by 45 degrees with respect to the crystalline structure of the receiving lower silicon wafer 210. It should be noted that the bonding and transfer of layer 208 to substrate 210 can be accomplished by conventional methods such as wafer bonding and layer transfer (SmartCut™), or by wafer bonding and backside grinding and etching of the donor wafer.

FIG. 3 shows a twist-bonded wafer 312 fabricated from the bonding of a top silicon layer 208 and lower silicon layer 210, in accordance with one embodiment of the present invention. One embodiment of the present invention, as described above, fabricates the twist-bonded wafer 312 using (100) oriented wafers such that the thin top silicon layer 208 has its crystalline structure rotated by 45 degrees with respect to the crystalline structure of the receiving lower silicon wafer 210. One embodiment of the present invention uses the twist-bonded wafer 312 as a basis for fabricating parallel P-FinFET and N-FinFET devices and thereby eliminating a 45 degree angle between these devices as exists in conventional devices.

It should be noted that twist-bonded wafers that have the crystalline structure of the two layers oriented at 45 degrees relative to each other is only one example. Any angle of rotation can be used as is required for a particular application.

In the example of fabricating parallel p-FinFET and N-FinFET devices, any angle between the two crystalline layers can be used such that the fins of the p-FinFET and n-FinFET are parallel in the finished device. For example, for twist bonded wafers constructed from two wafers having a surface orientation of (110), a rotational angle of 90 degrees can be used. As discussed below, the two wafers may also have different surface orientations, for example, (100) and (110).

In one embodiment, the thin (100)-oriented top silicon layer 208 and the (100) oriented receiving lower silicon wafer 210 can be bonded using any conventional bonding process. These layers 208, 210 can, for example, also be bonded with an oxide layer between the thin (100)-oriented top silicon layer 208 and the handle layer 210. In such an embodiment, for example, the silicon substrate of the (100)-oriented receiving lower silicon wafer 210 is first formed and a buried oxide layer is then formed thereon. The thin (100)-oriented top silicon layer 208 is rotated by the desired a given number of degrees relative to the handle layer 210 and is then bonded on top of the buried oxide layer. Alternatively, these layers can be bonded using a direct-silicon-bonding ("DSB") method. When DSB is used layers 208 and 210 are bonded directly without any interfacial layer. In such embodiments, for example, the thin (100)-oriented top silicon layer 208 can be referred as a DSB Si device layer 208.

Figure 4:
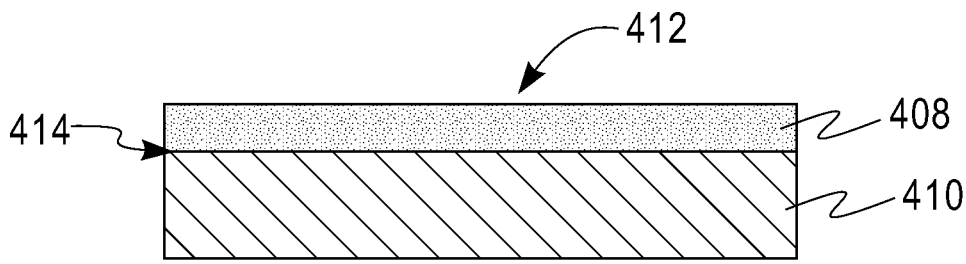
FIGS. 4-6 illustrate a fabrication process for forming a hybrid orientation wafer, in accordance with one embodiment of the present invention.
Figure 5:
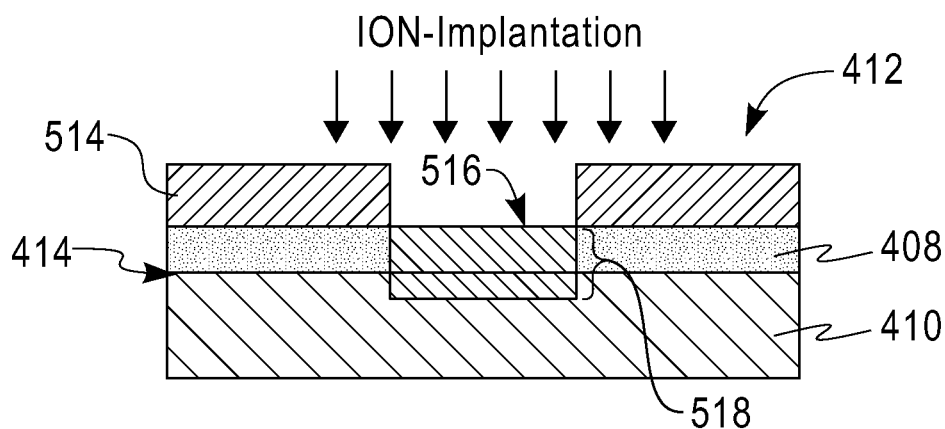
Figure 6:
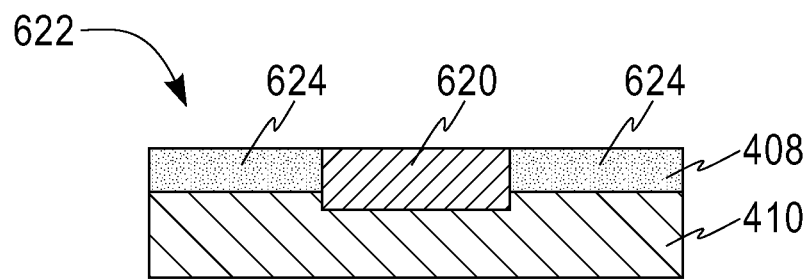

Once the twist-bonded wafer 312 is formed, as shown in FIG. 3, a hybrid orientation wafer may be formed using the fabrication processes shown in FIGS. 4-8. A hybrid orientation wafer includes adjacent regions formed on the wafer 312 that have different crystal orientations. In particular, FIGS. 4-6 show a method of forming these regions using an Amorphization Templated Re-crystallization method ("ATR"). ATR methods are discussed in greater detail in K. L. Saenger, J. P. De Souza, K. E. Fogel, J. A. Ott, A. Reznicek, C. Y. Sung, D. K. Sadana, and H. Yin, "An amorphization/templated recrystallization method for changing the orientation of single-crystal silicon: an alternative approach to hybrid orientation substrates," Appl. Phys. Lett. 87, 221911 (2005); K. L. Saenger, J. P. de Souza, K. E. Fogel, J. A. Ott, A. Reznicek, C. Y. Sung, H. Yin, and D. K. Sadana "Amorphization/Templated Recrystallization (ATR) Method for Hybrid Orientation Substrates" Mater. Res. Soc. Symp. Proc. Vol. 913 (2006); U.S. Pre-Grant Publication No. 2005/0116290 entitled "Planar Substrate With Selected Semiconductor Crystal Orientations Formed By Localized Amorphization And Recrystallization Of Stacked Template Layers"; and U.S. Pre-Grant Publication No. 2007/0241323 entitled "Trench-Edge-Defect-Free Recrystallization By Edge-Angle-Optimized Solid Phase Epitaxy: Method And Applications To Hybrid Orientation Substrates," all of which are hereby incorporated by reference in their entireties.

FIG. 4 illustrates a starting DSB substrate 412, in accordance with one embodiment of the present invention. The starting DSB substrate 412 of one embodiment includes a handle Si wafer 410 of a first orientation (j'k'l') that is bonded to a DSB Si device layer 408 of a second orientation (jkl). The starting DSB substrate 412 of one embodiment includes a bonded interface 414 between the handle Si wafer 410 and the device layer 408. In the configuration of the starting DSB substrate 412, the handle Si wafer 410 is also referred to as a receiving layer 410. As discussed above, the DSB Si device layer 408 and the handle Si wafer 410 have different orientations. For example layers 408 and 410 may have the same surface orientation, such as (100), but be rotated a given number of degrees with respect to each other. Alternatively layers 408 and 410 may have different surface orientations, such as (100) and (110). As described below, the starting DSB substrate 412 that includes these two layers allows p-FinFETS to be formed with a (110) surface orientation and n-FinFETS to be formed with a (100) surface orientation while keeping the fins for these FinFETS physically parallel to each other.

FIG. 5 illustrates an initial patterning step of the starting DSB substrate 412, in accordance with one embodiment of the present invention. A resist mask 514 is formed over the DSB Si device layer 408. Selected areas of the resist mask are then cleared, to expose selected areas 516 of the DSB Si device layer 408, as shown in FIG. 5.

The orientation of the exposed selected areas 516 of the DSB Si device layer 408 is to be changed, for example, by an ATR process in one embodiment of the present invention. The recrystallization in such an embodiment is templated from the vertically adjacent receiving layer 410, which has the desired crystalline orientation. FIG. 5 shows the exposed areas 516 of the DSB Si device layer 408 being amorphized by ion implantation (I/I) to create an amorphous Si (a-Si) volume 518 extending from the substrate surface down to a depth below the bonded interface 414. The ion implantation of one embodiment can include the implantation of $Si^+$ or $Ge^+$ ions, with the energy and dose selected to insure complete amorphization from the substrate's top surface to a depth below the DSB bonded interface 414.

FIG. 6 illustrates an amorphized region 518 after recrystallization (by an anneal process) to the orientation of the handle layer 410, in accordance with one embodiment of the present invention. Solid phase epitaxial regrowth occurs in the previously formed amorphous Si resulting in a region of material 620 that has an orientation corresponding to the handle Si layer 410. This wafer 622 can be referred to as a hybrid orientation wafer because it has adjacent regions, a region 620, and a region 624, with different crystal orientations. This recrystallized region of layer 620 has the orientation of the handle layer 410. For example (following directions as in FIG. 3), the remaining regions within twisted layer 624 of the DSB Si device layer 408 have a surface orientation of (010) while the recrystallized region 620 has also a surface orientation of (010) but its (101) planes are now parallel to the (100) plane of layer 408.

Figure 7:
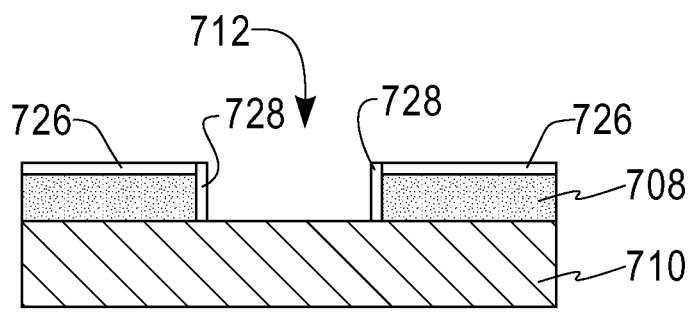
FIGS. 7-8 illustrate another fabrication process for forming a hybrid orientation wafer, in accordance with one embodiment of the present invention.
Figure 8:
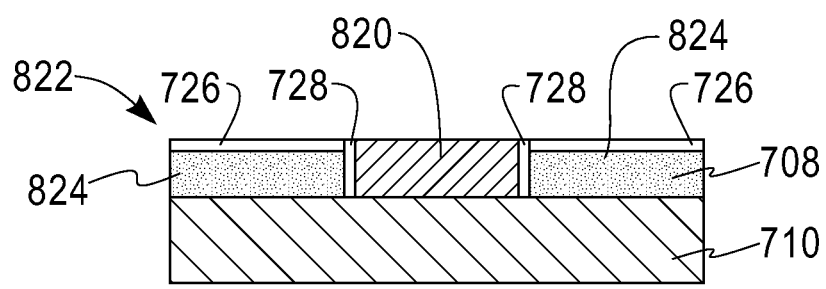

FIGS. 7-8 illustrate an alternative process for forming a hybrid orientation wafer, in accordance with an alternative embodiment of the present invention. In particular, FIGS. 7-8 illustrate a formation of a hybrid orientation wafer using a trench/regrowth method. Trench/regrowth methods are discussed in greater detail in Min Yang; Chan, V. W. C.; Chan, K. K.; Shi, L.; Fried, D. M.; Stathis, J. H.; Chou, A. I.; Gusev, E.; Ott, J. A.; Burns, L. E.; Fischetti, M. V.; Meikei Ieong, "Hybrid-orientation technology (HOT): opportunities and challenges," IEEE Transactions on Electron Devices, Vol. 53(5), pp. 965-978, (2006), which is hereby incorporated by reference in its entirety.

The process illustrated in FIGS. 7-8 uses a starting DSB substrate 712 that is similar to the starting DSB substrate 412 of FIG. 4 described above. The starting DSB substrate 712 includes a handle Si wafer 710 of a first orientation (j'k'l') and a DSB Si device layer 708 of a second orientation (jkl). The handle Si wafer 710 corresponds to the handle Si wafer 410 and the DSB Si device layer 708 is similar to the DSB Si device layer 408, both of which are discussed above. As discussed above with regards to the starting DSB substrate 412, at least one of the DSB Si device layer 708 and handle Si wafer 710 is rotated a given number of degree with respect to the other.

A hard mask 726 is formed over the DSB Si device layer 708 in order to etch through selected areas of the stack and expose the handle wafer 710, as is shown in FIG. 7. In one embodiment, lithography and reactive ion etching are used. Sidewall spacers 728 are then formed on the exposed sidewalls of the bonded layer 708. The sidewall spacers 728 may be formed, for example, by depositing a spacer material and performing an anisotropic etch. A selective epitaxial process is performed to grow a region of material 820 from the handle wafer 710 as shown in FIG. 8.

The handle wafer 710 shown in FIG. 8 is used as a template for the selective epitaxial process. The material 820 that is grown within the etched area has the same crystalline orientation as the handle wafer 710. Once the selective epitaxial process is finished, a chemical mechanical polishing process back polishes the grown material to the hard mask 726, which acts as a stop for the polishing process. It should be noted that the present invention is not limited to growing only silicon during the selective epitaxial process. For example, germanium, silicon and germanium, silicon and carbon, and other materials or combination of materials can be grown as well.

The resulting wafer 822 of FIG. 8 can be referred to as a hybrid orientation wafer because it has adjacent regions, layer 820, and a twisted layer 824, formed on the wafer 822 that have different crystal orientations. The selective epitaxial region of layer 820 has the crystalline orientation of the underlying handle layer 710 and the adjacent rotated layer 824 has the crystalline orientation of the original device layer 708. For example, the remaining regions 824 of the DSB Si device layer 708 have a surface orientation of (100) while the selective epitaxial region 820 region 820 has a surface orientation of (110) if substrate 710 has a surface orientation of (110). As a result of the epitaxial process the crystal orientation of region 820 always matches that of the substrate 710.

Embodiments of the present invention that form a hybrid orientation wafer using a trench/regrowth method, as is illustrated in FIGS. 7-8 and described above, are able to use a starting DSB substrate, such as is illustrated in FIG. 4, that further includes an interfacial insulating layer. In one embodiment, such an interfacial insulating layer, between the DSB Si device layer 708 and the underlying handle layer 710, may be thin to support its removal to expose the underlying handle wafer region for subsequent epitaxial regrowth.

One embodiment of the present invention that utilizes the ATR process incorporates an observation that certain silicon crystalline surface orientations and feature alignments are more favorable than others. For example, Si (001) in one embodiment is used for the bottom Si layer since Si solid phase epitaxy (SPE) on (001) surfaces is faster and tends to produce fewer defects than Si SPE on (011) surfaces. Silicon crystalline surface orientation and feature alignment are also selected in one embodiment to minimize the lateral dimensions of the boundary region between the volume having the original crystalline orientation and the volume having the different crystalline orientation. Boundary regions between these volumes that have different crystalline orientations comprise a mixture of top and bottom Si orientations and are therefore unsuitable for fin formation. One embodiment utilizes two (001) Si layers bonded with a 45 degree rotation, and boundaries of the changed regions running along the in-plane <100> directions of the lower Si layer.

The boundary region morphology for the above described crystalline orientations may be predicted with Saenger's nanofacet model described in K. L. Saenger et al., "A study of trench-edge defect formation in (001) and (011) Si recrystallized by solid phase epitaxy," J. Appl. Phys. 101, 024908 (2007) and K. L. Saenger et al., "Mask-edge defects in hybrid orientation direct-Si-bonded substrates recrystallized by solid phase epitaxy after patterned amorphization," J. Appl. Phys., 101 084912 (2007), the entire contents of which are hereby incorporated herein by reference.

FIGS. 14-17 illustrate a structural configuration used with and predictions determined according to Saenger's nanofacet model for two cases in which a substrate comprising two (001) layers are bonded with the crystalline orientation of one layer rotated 45 degrees relative to the other. A changed-orientation region in each case is formed by amorphizing to a depth just below the bonded interface.

Figure 14:
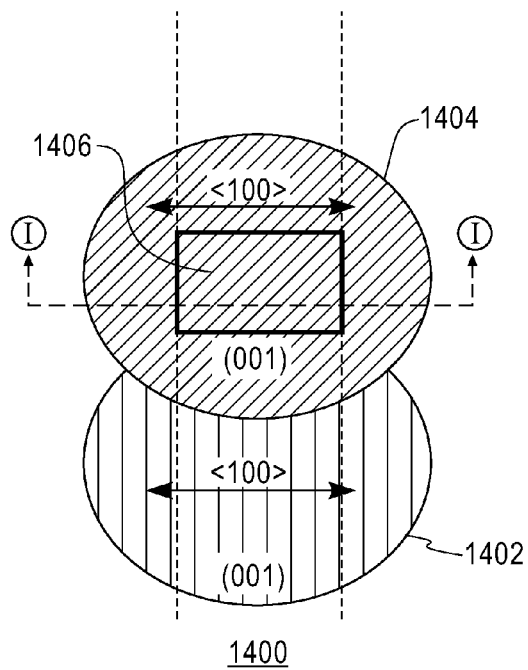
FIG. 14 illustrates a first crystalline silicon layer stack used with the Saenger's nanofacet model.

FIG. 14 illustrates a first crystalline silicon layer stack 1400 used with Saenger's nanofacet model. The first crystalline silicon layer stack 1400 has an upper layer 1404 and a lower layer 1402. A first changed orientation region 1406 is formed with the ATR process and has a crystalline orientation that is aligned with the lower layer's in-plane <110> direction, as is illustrated in FIG. 14.

Figure 15:
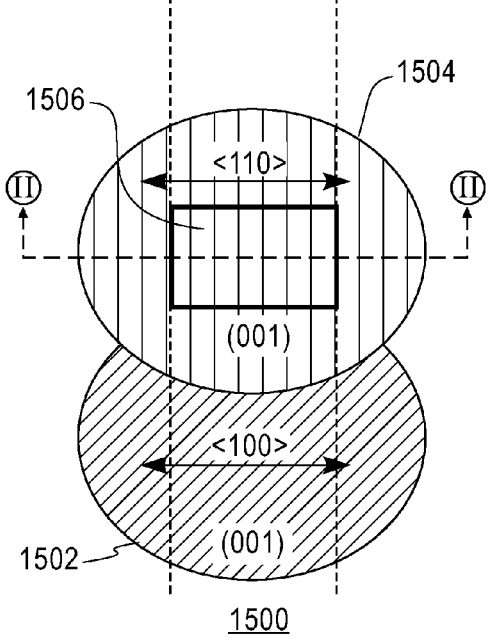
FIG. 15 illustrates a second crystalline silicon layer stack used with the Saenger's nanofacet model.

FIG. 15 illustrates a second crystalline silicon layer stack 1500. The second crystalline silicon layer stack 1500 is similar to the first crystalline silicon layer stack 1400 described above. The second crystalline silicon layer stack 1500 has an upper layer 1504 and a lower layer 1502. A second changed orientation region 1506 of the second crystalline silicon layer stack is formed with the ATR process and has a crystalline orientation that is aligned with the bottom layer's in-plane <100> direction, as illustrated in FIG. 15.

Figure 16:
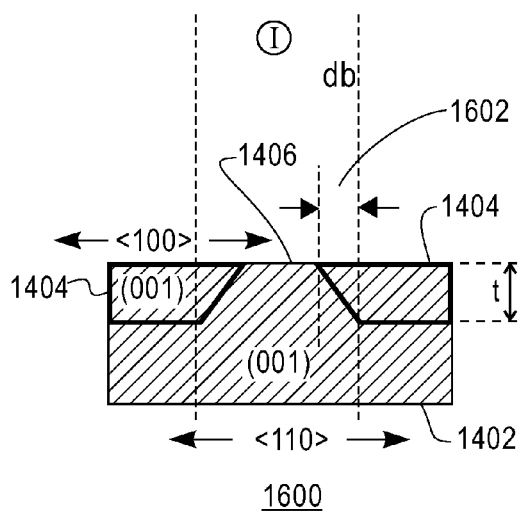
FIG. 16 illustrates a cross-sectional view of the boundary region morphology predicted with Saenger's nanofacet model for a first crystalline silicon layer.

FIG. 16 illustrates a cross-sectional view 1600 of the first crystalline silicon layer stack 1400, where the first changed orientation region has <110>-direction alignment. Saenger's nanofacet model predicts that the width of the boundary region 1602, which is represented as "db," should be essentially 1.0*t, where t is the thickness of the top layer 1404. This prediction is due to the equal horizontal and vertical SPE rates that cause the SPE fronts to meet at an angle of 45°, as is shown in FIG. 16. In the first crystalline silicon layer stack 1400, facet formation that is ordinarily present at the edges of the vertical-direction SPE is absent because lateral growth rates are so fast.

Figure 17:
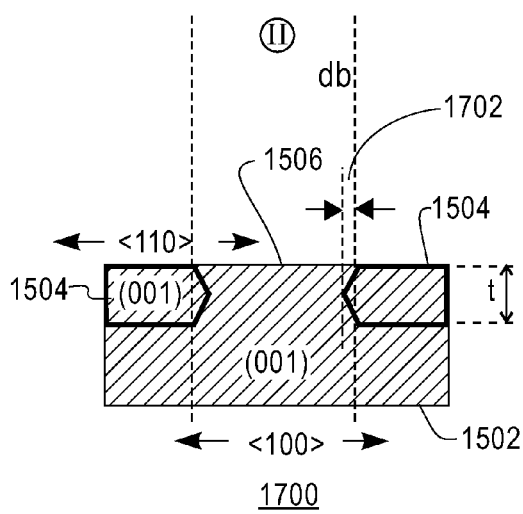
FIG. 17 illustrates a cross-sectional view of the boundary region morphology predicted by Saenger's nanofacet model for a second crystalline silicon layer.

FIG. 17 illustrates a cross-sectional view 1700 of the second crystalline silicon layer stack 1500, where the second changed orientation region has <100>-direction alignment. The Saenger's nanofacet model predicts that the width of the boundary region 1702 in this case is much smaller, i.e., <0.351, where t is the thickness of top layer 1504. The geometry illustrated in FIG. 17 thus yields narrower boundary regions.

Figure 9:
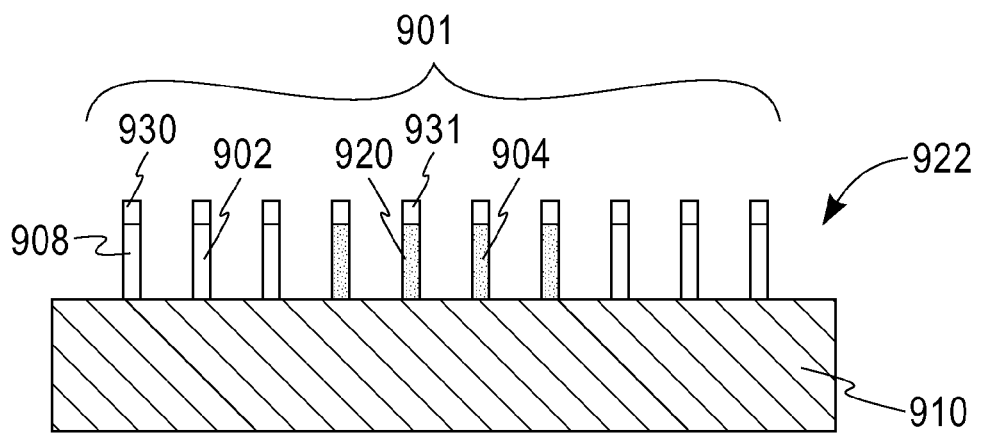
FIG. 9 illustrates the results of a fabrication process for forming fins for FinFETs in a hybrid orientation wafer, in accordance with one embodiment of the present invention.

FIG. 9 illustrates a plurality 901 of parallel fins such as fins 902, 904 for p-FinFETs and n-FinFETs that are etched into the rotated layer 908 and the re-growth area 920 of hybrid orientation wafer 922, in accordance with one embodiment of the present invention. The view of FIG. 9 is a side cross-sectional view of such a hybrid orientation wafer 922, which is able to be a hybrid orientation wafer 622, 822 that is illustrated in FIGS. 6 and 8 and created as discussed above.

In particular, a hard mask 930, 931 is formed over areas of the stack where fins are to be formed. Reactive ion etching is performed to create structures with approximately vertical sidewalls. Etching chemistry can be selected that is particular to the materials of the twisted layer 908 and regrowth areas 920. The etching process results in fins 902, 904 that are parallel to each other, as shown in FIG. 9. Some of the fins are formed from the twisted layer 908 and some of the fins are formed from the regrowth area 920. In one embodiment, p-FinFETs are formed in the regrowth regions 920 having an orientation of (110) and n-FinFETS are formed in the transfer layer 908 having the orientation of (100).

Figure 10:
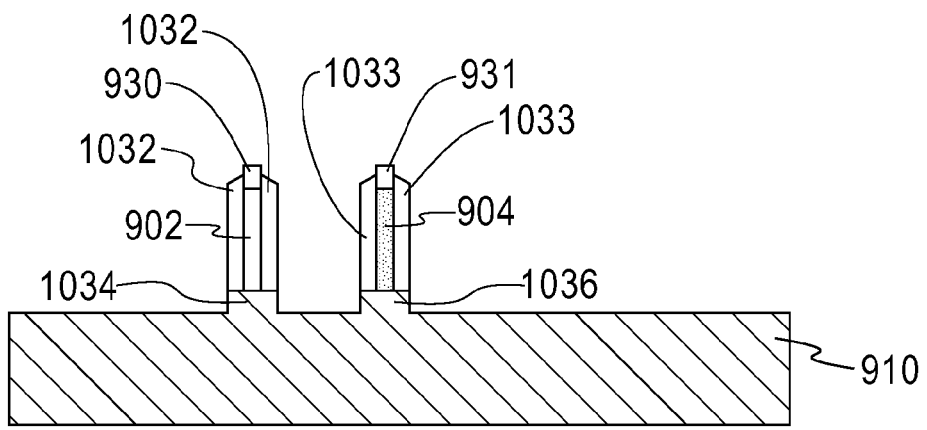
FIGS. 10-11 illustrate a fabrication process for electrically isolating the fins formed in FIG. 9, in accordance with one embodiment of the present invention.
Figure 11:
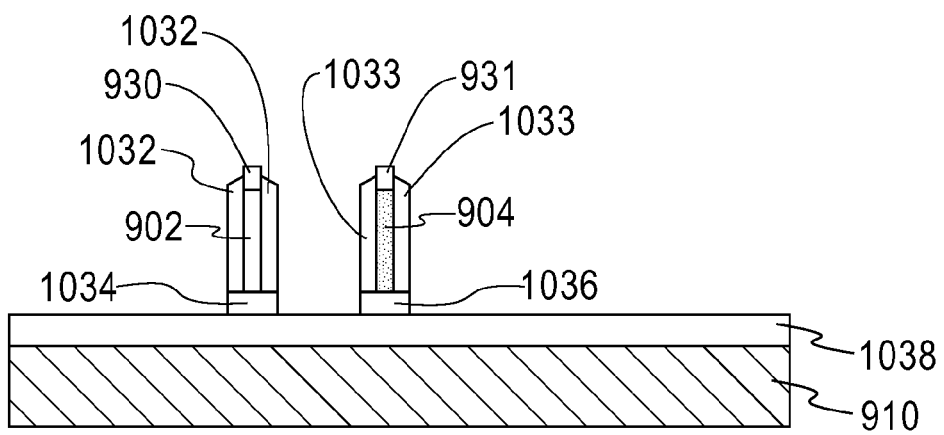

Once the fins 902, 904 are created, they can be electrically isolated from each other in order to create properly independent FinFET devices. For example, FIGS. 10-11 show a process for electrically isolating each fin. In particular, FIG. 10 shows that the hard mask 930 remains on top of each fin 902, 904 (other fins are not drawn for clarity). The hard mask 930 protects each fin 902, 904 from a silicon etching process discussed below. Barrier spacers 1032, 1033 are formed around the fins 902, 904, thereby encapsulating the fins 902, 904. The barrier spacer material 1032, 1033 can be any material such as silicon nitride that acts as a diffusion barrier for silicon oxidation.

A silicon etching process is performed that results in raised areas of silicon 1034, 1036 under each fin 902, 904 and associated barrier spacers 1032, 1033. These raised areas of silicon 1034, 1036 act as a base for each fin 902, 904 and extend outwards under the barrier spacer 1032, 1033. A portion 1038 of the handle layer 910 is then oxidized along with the base 1034, 1036 of each fin 902, 904 in order to create an insulating silicon dioxide layer in these regions. This process results in each of the fins 902, 904 being electrically isolated from one another. The barrier spacer material 1032, 1033 can be removed and conventional processing can be performed to complete the fabrication of the Fin FETs.

Figure 12:
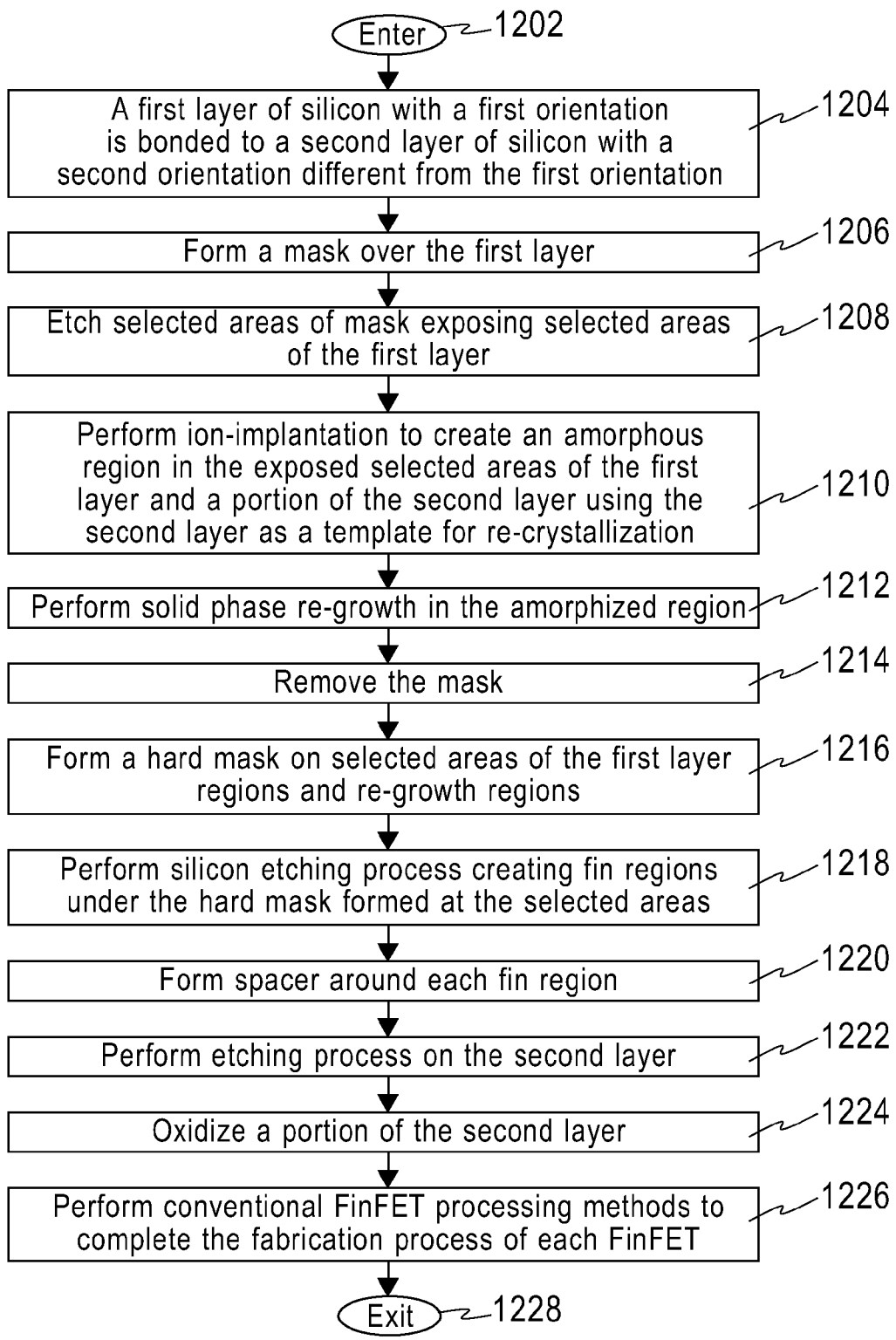
FIG. 12 illustrates a FinFET fabrication process flow diagram in accordance with one embodiment of the present invention.

FIG. 12 illustrates FinFET fabrication process flow diagram 1200 in accordance with one embodiment of the present invention. The FinFET fabrication process flow diagram 1200 begins at step 1202 and flows directly into step 1204. A first layer of silicon with a first orientation, at step 1204, is bonded to a second layer of silicon with a second orientation different from the first. For example, each of the first layer and second layers of silicon can have a surface orientation of (010), however, by rotating the layers with respect to one another, one layer has (100) planes that are now parallel to the other layer's (101) planes.

A resist mask, at step 1206, is formed over the first layer. An etching process, at step 1208, is performed to selectively remove portions of the mask and expose selected areas of the first layer. Ion implantation, at step 1210, is performed to create an amorphous region in the exposed selected areas of the first layer and portions of the second layer that are under the exposed first layer. The second layer is used as a template for re-crystallization. The resist mask, at step 1214, is then removed. Solid phase regrowth, at step 1212, is performed in the amorphized region creating a region of material having an orientation which is the same as the second layer.

This results in a wafer with regions of the first layer having the first orientation adjacent to the re-growth layer having the second orientation. A hard mask, at step 1216, is formed on selected areas of the first layer regions and the re-growth regions. Silicon etching, at step 1218, is performed which creates fin regions under the hard mask formed at the selected areas. Spacers, at step 1220, are formed around each fin and a silicon etching process is performed at step 1222. This silicon etching process creates a raised area of silicon under each of the fins that extends the width of the spacer. A portion of the second layer including the base under each fin, at step 1224, is oxidized. Conventional FinFET processing methods, at step 1226, are performed in one embodiment to complete the fabrication process of each FinFET. The control flow then exits at step 1228.

Figure 13:
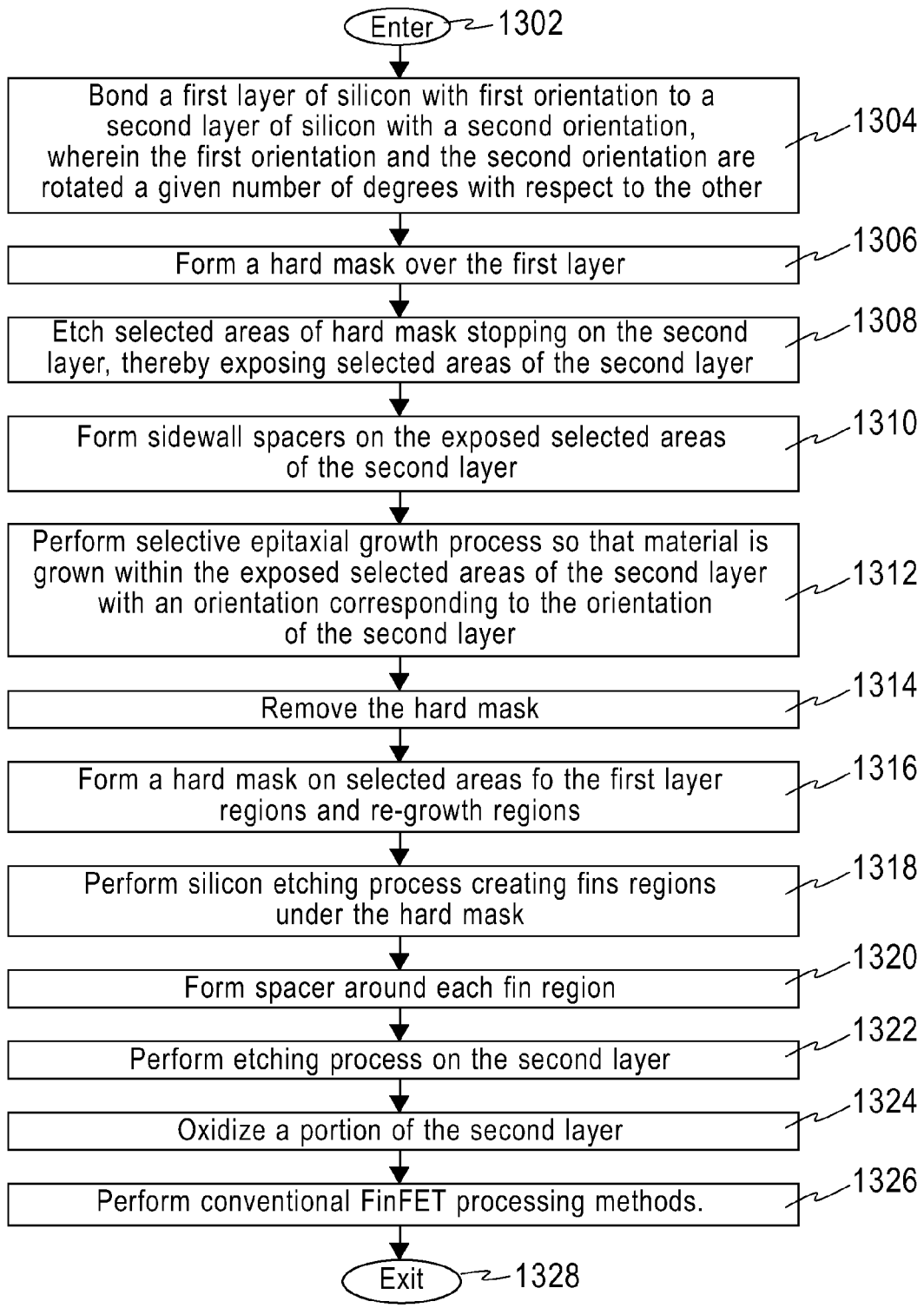
FIG. 13 illustrates another FinFET fabrication process flow diagram in accordance with one embodiment of the present invention.

FIG. 13 illustrates an alternative FinFET fabrication process flow diagram 1300 in accordance with another embodiment of the present invention. The FinFET fabrication process flow diagram 1300 begins at step 1302 and flows directly into step 1304. A first layer of silicon with a first orientation, at step 1304, is bonded to a second layer of silicon with a second orientation, wherein the first and second orientations are rotated with respect to each other. For example, each of the first layer and second layers of silicon can have a surface orientation of (010), however, by rotating the layers with respect to one another, one layer has (100) planes that are now parallel to the other layer's (101) planes A hard mask, at step 1306, is formed over the first layer. An etching process is performed to selectively remove portions of the mask and the underlying first layer, thereby exposing selected areas of the second layer. Sidewall spacers, at step 1310, are formed on the sidewalls of the exposed first layer. Selective epitaxial growth, at step 1312, is performed to grow a region of material in the etched area. The second layer is used as a template to orientate the grown region according to the orientation of the second layer. Any over-growth of the grown material is back polished to the hard mask.

This results in a wafer with regions of the first layer having the first orientation adjacent to the regrowth layer having the second orientation. The hard mask, at step 1314, is then removed. A hard mask, at step 1316, is formed on selected areas of the first layer regions and the regrowth regions. Silicon etching, at step 1318, is performed which creates fin regions under the hard mask formed at the selected areas. Spacers, at step 1320, are formed around each fin and a silicon etching process is performed at step 1322. This silicon etching process creates a raised area of silicon under each of the fins that extends the width of the spacer. A portion of the second layer including the base under each fin, at step 1324, is oxidized. Conventional FinFET processing methods, at step 1326, are performed in one embodiment to complete the fabrication process of each FinFET. The control flow then exits at step 1328.

It should be noted that an integrated circuit fabrication apparatus can be adapted to perform the processes discussed above with respect to FIGS. 12 an 13. In addition, the integrated circuit fabrication apparatus can include a bonding control processor that is adapted to bond a first silicon layer having a first crystalline orientation to a second silicon layer having a second crystalline orientation that is different from the first crystalline orientation. A material growth processor can be adapted to form, in a region of a surface of the first silicon layer, a volume of material extending through the first silicon layer from the second layer up to the surface of first layer. The material has a crystalline orientation that substantially matches the crystalline orientation of second layer. The integrated circuit fabrication apparatus can also include an etching processor that adapted to selectively etch areas of the surface of the first layer that are outside of the region to create a first plurality of fins and areas inside the region to create a second plurality of fins. The first and second plurality of fins is parallel to each other.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments. Furthermore, it is intended that the appended claims cover any and all such applications, modifications, and embodiments within the scope of the present invention.

What is claimed is:

1. An electronic circuit comprising at least one p-FinFET device and at least one n-FinFET device, wherein the at least one p-FinFET device and the at least one n-FinFET device are situated parallel to each other on a hybrid orientation semiconductor substrate, the integrated circuit being fabricated according to a process comprising:
    forming a substrate comprising a first layer and a second layer, wherein the forming comprises bonding the first layer having a first crystalline orientation to a second layer having a second crystalline orientation different from the first crystalline orientation, wherein the first layer is situated on and contacts a top surface of the second layer;
    forming, in a region of a surface of the first layer, a volume of material extending through the first layer from the second layer up to the surface of first layer, wherein the material has a crystalline orientation that substantially matches the crystalline orientation of the second layer;
    selectively etching areas of the surface of the first layer that are outside of the region to create a first plurality of fins and areas inside the region to create a second plurality of fins, wherein the first and second plurality of fins are parallel to each other, and wherein the etching stops at the top surface of the second layer of the substrate;
    forming a spacer around each fin in the first plurality of fins and second plurality of fins, wherein a bottom portion of the spacer contacts a top surface of the second layer;
    recessing a set of regions of the second layer between each fin in the first plurality of fins and the second plurality of fins to form a base with exposed sidewalls under each fin in the first plurality of fins and the second plurality of fins, wherein the base formed under each fin is thicker than an exposed base of the set of regions of the second layer; and
    oxidizing the base under each fin and a set of exposed regions between each fin, the oxidizing forming an isolation layer between and under each fin in the first plurality of fins and the second plurality of fins.

2. The electronic circuit of claim 1, wherein forming a volume of material comprises:
    amorphizing a portion of the first layer and a portion of the second layer within the region to create an amorphized region;
    allowing the amorphized region to recrystallize such that the crystalline orientation of the second layer is used as a recrystallization template for the amorphized region.

3. The electronic circuit of claim 2, wherein allowing the amorphized region to recrystallize, further comprises:
    performing solid phase regrowth in the amorphized region, wherein the solid phase regrowth grows material in the amorphized region having a crystalline orientation that substantially matches the crystalline orientation of the second layer.

4. The electronic circuit of claim 1, wherein forming a volume of material further comprises:
    selectively etching a portion of the first layer to expose an underlying portion of the second layer; and
    epitaxially forming material within the portion of the first layer that has been etched.

* * * * *